United States Patent [19]
McGinn

[11] Patent Number: 4,829,264
[45] Date of Patent: May 9, 1989

[54] ALL NPN DIFFERENTIAL TO SINGLE ENDED AMPLIFIER

[75] Inventor: Michael McGinn, Scottsdale, Ariz.
[73] Assignee: Motorola, Inc., Schaumburg, Ill.
[21] Appl. No.: 213,853
[22] Filed: Jun. 30, 1988
[51] Int. Cl.[4] ............................................. H03F 3/45
[52] U.S. Cl. .................................. 330/252; 330/259
[58] Field of Search ............... 330/252, 258, 259, 260, 330/261

[56] References Cited
U.S. PATENT DOCUMENTS
4,626,770 12/1986 Price, Jr. ........................ 330/259 X Primary Examiner—Steven Mottola
Attorney, Agent, or Firm—Michael D. Bingham

[57] ABSTRACT

An amplifier is provided for supplying a single output signal responsive to applied differential input signals applied to respective inputs thereof. The amplifier includes a differential input section having inputs coupled respectively to the inputs of the amplifier and a closed feedback loop including only NPN transistors which is coupled between the output of the differential input section and one of the inputs of the amplifier for providing a feedback signal to force the voltages at the inputs of the amplifier to be equal. In addition, the signal output signal is produced at an output of the closed feedback loop.

9 Claims, 1 Drawing Sheet

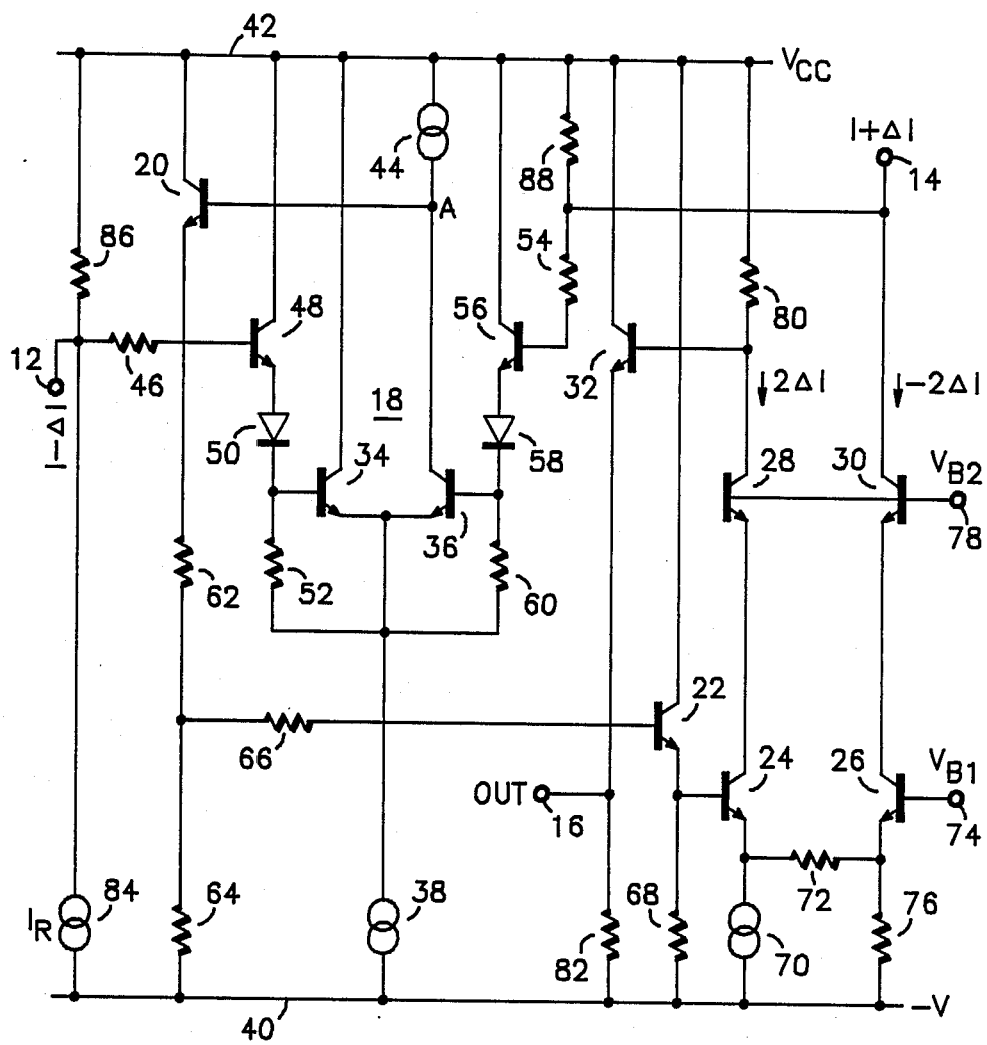

4,829,264

ALL NPN DIFFERENTIAL TO SINGLE ENDED AMPLIFIER

BACKGROUND OF THE INVENTION

The present invention relates to NPN transistor amplifiers and, more particularly, to such an amplifier which is suited to be used as a video amplifier in a television IF video demodulator section.

In high quality television receivers it is required to obtain low differential gain and phase distortion in the video IF demodulator section of the television receiver to prevent undesirable distortion of the video signal. One source of the aforementioned distortion is the video amplifier of the IF demodulator section. It is therefore desirable to provide a video amplifier in the television receiver which exhibits the foregoing requirements.

Typically the input signal to the video amplifier is supplied from the output of the video demodulator Since the demodulator differential output signal is usually at or near the positive supply voltage it must be level shifted downward toward the negative supply voltage in order to obtain usable video signal levels.

Hence, a need exists for an improved differential to single ended amplifier circuit which is suitable for use as a television video amplifier having reduced differential gain and phase errors while providing accurate voltage level shifting.

SUMMARY OF THE INVENTION

Accordingly, it is an object of the present invention to provide an improved amplifier.

It is another object of the invention to provide an improved video amplifier.

Still another object is to provide an improved differential to single ended amplifier that is suited to be used as a video amplifier in a television receiver.

In accordance with the above and other objects there is provided an amplifier responsive to an applied differential input signal for providing a single output signal comprising a differential input section having an output and a closed feedback loop including only NPN transistors which is coupled between the output of the differential input section and one of the pair of inputs to which the differential signal is applied for forcing the voltages at the pair of inputs to be equal while providing the single output signal at an output thereof.

BRIEF DESCRIPTION OF THE DRAWING

The sole FIGURE is a schematic diagram illustrating the amplifier of the present invention.

DETAILED DESCRIPTION OF THE PREFERRED EMBODIMENT

Turning now to the FIGURE there is shown amplifier 10 of the preferred embodiment which is suited to be utilized as a video amplifier in a television receiver. In general, amplifier 10 provides a single output signal at output 16 in response to receiving a differential input signal supplied at inputs 14. As will be described in more detail later, amplifier 10 includes a feedback loop incorporating level shifting within the loop. The feedback loop comprises NPN transistors 20, 22, 24, 26, and 30 in cooperation with differential amplifier 18 for maintaining the voltage levels at inputs 12 and 14 substantially equal while converting the differential input signals to a single output signal via transistors 28 and 32 at output 16. Differential amplifier stage 18 includes transistors 34 and 36 the emitters of which are connected via current supply 38 to the negative supply rail 40 to which ground or negative potential $V_{EE}$ is supplied. The collector of transistor 34 is directly coupled to positive supply rail 42 to which is supplied the operating potential $V_{CC}$ while the collector of transistor 36 is returned thereto via current supply 44. Input terminal 12 is coupled via resistor 46 to the base of transistor 34 through a first voltage level shifting circuit comprising NPN transistor 48, and diode 50. Similarly, input 14 is coupled via resistor 54 to the base of transistor 36 through a second voltage level circuit comprised on NPN transistor 56, and diode 58. Resistors 52 and 60, coupled between the respective bases of transistors 34 and 36 to current supply 38, provide base biasing.

The output of differential amplifier 18 is supplied to the feedback loop at the base of transistor 20, the collector-emitter conduction path of which is coupled in series between supply rails 40 and 42 via a resistive divider network including resistors 62 and 64. The interconnection point between resistors 62 and 64 is coupled via resistor 66 to the base of transistor 22. Transistor 22, which is configured as an emitter follower stage provides a level shifted voltage across resistor 68 to the base of transistor 24. The emitter of transistor 24 is coupled both to current supply 70 and the emitter of transistor 26 through resistor 72. Transistor 26, which has its base coupled at terminal 74 to a first reference potential $V_{B1}$ provides the feedback signal through its collector-emitter conduction path via transistor 30 and resistor 76 to input 14 with the base of the latter transistor being coupled to a second reference potential $V_{B2}$ at terminal 78.

The single output signal from amplifier 10 is developed across resistor 80 which is coupled in series between positive rail 42 and the collector of transistor 28, the collector-emitter conduction path of which is coupled in series with the collector of transistor 24. The output signal is buffered by transistor 32 and resistor 82 and appears at output 16 across resistor 82.

There are two operating states of amplifier 10: the quiescent operating state with no differential input signals applied to inputs 12 and 14, and the normal operating state with input signals applied at the inputs.

Quiescent Operation

In a quiescent state the operation of amplifier is such that a pair of direct currents I flow through resistors 86 and 88 through inputs 12 and 14. These currents are established through the input circuit (not shown) that is coupled to the inputs 12 and 14. For example, if amplifier 10 is utilized as a video amplifier, inputs 12 and 14 would be coupled to the balanced outputs of the video demodulator of the television receiver to receive the video composite signal therefrom.

If, for any reason, differential amplifier 18 is not in a balanced state, i.e., both transistors 34 and 36 conducting equally, an error signal is generated to force the voltages at inputs 12 and 14 to be equal. Hence, the feedback loop forces the current flowing through the collector of transistor 30 to be substantially equal to the current $I_R$ set by current supply 84. The manner in which this is done is described hereinafter. For instance, if the voltage at input 14 is less than the voltage at input 12, transistor 34 will conduct harder than transistor 36 which causes node A to rise in voltage level thereby turning transistor 20 of the feedback loop on harder. Transistor 22 is thus turned on which, in turn, causes a current to flow through transistor 24 and resistor 72 to the emitter of transistor 26. Transistor 26 is therefore de-biased and will tend to conduct less which reduces the current flow through transistor 30. As a result, the voltage level at the collector of transistor 30 will rise until such time that the voltage level at input 14 becomes equal to the voltage appearing at input 12. Under this balanced condition, the current flowing through transistors 26 and 30 has been reduced to the value of $I_R$. Similarly, if the voltage at input 14 is greater than the DC voltage at input 12, the feedback loop will force transistor 30 to be rendered more conductive thereby reducing the voltage level at its collector, and consequently the voltage at input 14, until the current through its collector is equal to $I_R$ and the voltage levels at inputs 12 and 14 are equal.

Thus, node A will float, i.e., the voltage level thereat will be forced to the correct value to balance the quiescent operating condition of amplifier 10 as the voltage levels at the inputs are forced to be equal by the feedback loop. Hence, any mismatch or component tolerances, as well as any error in the voltage level shifting within the loop, that otherwise would cause an unbalanced operating condition, appear at node A and not at the base of transistor 24. Moreover, after the feedback loop has forced the voltages at inputs 12 and 14 to be equal, zero current flows through resistor 72.

Thus, under zero carrier or no signal input, output 16 is set at a predetermined voltage level below $V_{CC}$ due to the quiescent DC conduction state of transistor 28 and buffer transistor 32. The output voltage level can be set by scaling the value of load resistor 80 and the value of current supply 70.

Applied Input Signal Operation

When a differential input signal, $\pm\Delta I$, appears at inputs 12 and 14 the voltage level thereat will be forced by the feedback loop to be equal as described above. In so doing the current flowing through resistor 72 is forced to be twice the value of the differential current. Thus, the feedback current and the load current is equal to the absolute magnitude of $2\Delta I$. Thus, the output signal varies from the no signal level in response to the differential input signal with the gain being determined by the scaling of resistors 80 and 82.

Hence, what has been described is a novel amplifier circuit for providing a single output signal in response to receiving a differential input signal. The amplifier includes a feedback loop, with voltage level shifting occurring within the loop, for forcing the voltage levels at the inputs of the amplifier to be equal during operation thereof.

What is claimed is:

1. A differential to single ended amplified circuit for providing a single output signal in response to receiving alternating current (AC) differential input signals, comprising:
   a first input of the amplifier which receives a first differential input of a particular phase;
   a second input of the amplifier which receives a second differential input signal which is substantially opposite in phase with respect to said particle phase of said first differential input signal;
   a differential input stage having first and second inputs respectively coupled to said first and second inputs of the amplifier and an output;
   a first current supply coupled to said first input of the amplifier;
   a feedback loop coupled between said output of said differential input stage and said second input of the amplifier which is responsive to said differential input stage for providing a feedback signal only to said second input of the amplifier to force the voltage thereat to be substantially equal voltage appearing at said first input to the amplifier, said feedback loop including circuit means for level shifting the output signal appearing at said output of said differential input stage said feedback loop having an output which is provided the single output signal.

2. The amplifier of claims 1 including output circuit means coupled to said output of said feedbackloop and an output of the amplifier.

3. A differential to single ended amplifier circuit for providing a sing output signal in response to receiving differential input signals, comprising
   a differential input stage having first and second input respectively coupled to first and second inputs of the amplifier and an output;
   a first current supply coupled to said first input of the amplifier;
   a feedback loop coupled between said output of said differential input stage and said second input of the amplifier which is responsive to said differential input stage for providing a feedback signal at said second input force the voltage thereat to be substantially equal to the voltage appearing first input to the amplifier, said feedback loop including circuit means for shifting the output signal appearing at said output of said differential input stage, said feedback loop having an output at which is provided the single output signal:
   a first NPN transistor having a collector, an emitter and a base, said collector being coupled to said output of said feedback loop;
   said circuit means within said feedback loop being coupled between said output of said differential input stage and said base of said first NPN transistor;
   a second NPN transistor having a base coupled to a first terminal to which is supplied a first reference potential and its collector-emitter conduction path
   a first resistor coupled between said emitter of said fir and the emitter of said second NPN transistor.

4. The amplifier of claim 3 wherein said output circuit means includes a transistor emitter follower stage coupled between said output of said feedback loop and the output of the amplifier.

5. The amplifier of claim 4 wherein said circuit means within said feedback loop includes:
   a third NPN transistor configured as an emitter follower having its base coupled to said output of said differential input stage;
   second and third resistors coupled in series with the collector-emitter conduction path of said third NPN transistor at the emitter of said third NPN transistor; and
   a fourth NPN transistor configured as an emitter follower having its base coupled to the interconnection between said second and third resistors.

6. The amplifier of claim 5 including a fifth NPN transistor having a base, an emitter and a collector, said base being coupled to a second terminal to which is supplied a second reference potential and its collector-emitter conduction path coupled between said second input of the amplifier and the collector of said second NPN transistor.

7. The amplifier of claim 6 including a sixth NPN transistor having a base, collector and an emitter, said base being coupled to said second terminal and its collector-emitter conduction path coupled between said output of said feedback loop and said collector of said first NPN transistor.

8. The amplifier of claim 7 including
said transistor emitter follower stage including a seventh NPN transistor having a base, collector and an emitter, said base being coupled to said output said feedback loop, said collector being coupled to a first power supply conductor;

a fourth resistor coupled between said emitter of said seventh NPN transistor and a second power supply conductor; and a fifth resistor coupled between said output of feedback loop and said first power supply conductor.

9. The amplifier of claim 8 including
a second current supply coupled to said emitter of said first NPN transistor;

a sixth resistor coupled between the emitter of said second NPN transistor and a second power supply conductor;

a seventh resistor coupled between said first input of the amplifier and said first power supply conductor; and a eighth resistor coupled between said second input of the amplifier and said first power supply conductor.

* * * * *

UNITED STATES PATENT AND TRADEMARK OFFICE
CERTIFICATE OF CORRECTION

PATENT NO. : 4,829,264

DATED : May 9, 1989

INVENTOR(S) : Michael McGinn

It is certified that error appears in the above-identified patent and that said Letters Patent is hereby corrected as shown below:

Column 3, claim 1, line 61, following "input" insert --signal--.

Column 3, claim 1, line 64, delete "particle" and insert therefor --particular--.

Column 4, claim 1, line 8, following "equal" insert --to the--.

Column 4, claim 1, line 12, following "stage" insert --,--.

Column 4, claim 3, line 19, delete "sing" and insert therefor --single--.

Column 4, claim 3, line 20, following "comprising" insert --:--.

Column 4, claim 3, line 21, delete the second occurrence of "input" and insert therefor --inputs--.

Column 4, claim 3, line 31, following "appearing" insert --at said--.

Column 4, claim 3, line 33, following "for" insert --level--.

Column 4, claim 3, line 46, following "path" insert --coupled to said second input of the amplifier; and--.

Column 4, claim 3, line 47, delete "fir" and insert therefor --first NPN transistor--.

UNITED STATES PATENT AND TRADEMARK OFFICE
CERTIFICATE OF CORRECTION

PATENT NO. : 4,829,264

DATED : May 9, 1989

INVENTOR(S) : Michael McGinn

It is certified that error appears in the above-identified patent and that said Letters Patent is hereby corrected as shown below:

Column 5, line 15, Claim 8, following "output" insert -- of --.

Signed and Sealed this

Tenth Day of October, 1989

Attest:

DONALD J. QUIGG

Attesting Officer

Commissioner of Patents and Trademarks